United States Patent
Lee et al.

(10) Patent No.: US 12,206,391 B2
(45) Date of Patent: Jan. 21, 2025

(54) PRE-DRIVEN BOOTSTRAPPING DRIVERS

(71) Applicant: Efficient Power Conversion Corporation, El Segundo, CA (US)

(72) Inventors: Edward Lee, Fullerton, CA (US); Ravi Ananth, Laguna Niguel, CA (US); Michael Chapman, Long Beach, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 18/062,756

(22) Filed: Dec. 7, 2022

(65) Prior Publication Data

US 2023/0188127 A1  Jun. 15, 2023

Related U.S. Application Data

(60) Provisional application No. 63/288,063, filed on Dec. 10, 2021.

(51) Int. Cl.
H03K 17/0412 (2006.01)

(52) U.S. Cl.
CPC ........... H03K 17/04123 (2013.01); *H03K 2217/0063* (2013.01); *H03K 2217/0072* (2013.01)

(58) Field of Classification Search
CPC ..... H03K 17/04123; H03K 2217/0063; H03K 2217/0072
See application file for complete search history.

(56) References Cited

U.S. PATENT DOCUMENTS

| | | | |
|---|---|---|---|
| 4,546,276 A | * | 10/1985 | Freyman .......... H03K 19/01714 326/88 |
| 4,680,488 A | | 7/1987 | Okumura et al. |
| 10,790,811 B2 | | 9/2020 | Lee et al. |
| 11,038,503 B2 | | 6/2021 | Lee et al. |
| 2012/0013394 A1 | | 1/2012 | Koyama |
| 2020/0076415 A1 | | 3/2020 | Lee et al. |
| 2020/0076426 A1 | | 3/2020 | Lee et al. |

FOREIGN PATENT DOCUMENTS

| | | |
|---|---|---|
| CN | 205105191 | 3/2016 |
| CN | 113196662 A | 7/2021 |
| TW | 202023195 A | 6/2020 |
| TW | 202025632 A | 7/2020 |

\* cited by examiner

*Primary Examiner* — Ryan Johnson
*Assistant Examiner* — Colleen J O'Toole
(74) *Attorney, Agent, or Firm* — Blank Rome LLP

(57) ABSTRACT

A bootstrapping gate driver circuit in which the size of the bootstrap capacitors is reduced. The gate-to-source voltage of the high side (pull-up) FET is pre-driven to an initial voltage (pre-driven voltage) before the bootstrap capacitor releases charge to charge up the gate-to-source voltage of the high side FET. This pre-driven voltage is applied through a pre-driven FET that allows current flow from the supply voltage to charge the gate of the high side FET to the pre-driven voltage. The pre-driven FET is turned on by a turn-on signal that occurs before the bootstrap capacitor releases charge. The pre-driven period (and hence, the pre-driven voltage) is determined from the time that the pre-driven FET begins to turn on, to the time that the bootstrap capacitor starts to release charge.

8 Claims, 6 Drawing Sheets

PRE-DRIVEN BOOTSTRAPPING DRIVERS

CROSS-REFERENCE TO RELATED APPLICATION

This application claims the benefit of U.S. Provisional Application No. 63/288,063 filed Dec. 10, 2021, the disclosure of which is incorporated by reference in its entirety.

BACKGROUND OF THE INVENTION

Typical high side FET gate drivers rely on a bootstrapping circuit to provide an increased voltage to a gate terminal of the high side FET. Bootstrapping gate drivers store energy in the form of charge in capacitors while an associated high side FET is turned off, and use the stored charge to apply a voltage greater than a supply voltage to the gate terminal of the high side FET, keeping it turned on despite increases in voltage on a source terminal of the high side FET.

FIG. 1 is a schematic of a conventional bootstrapping gate driver for a high side power FET. In FIG. 1, system 100 includes a bootstrapping gate driver 170, a high side FET 194, a low side FET 192 and an output. Bootstrapping gate driver 170 is coupled to the gate terminal of high side FET 194. The drain terminal of FET 194 is coupled to a supply voltage source $V_{dd}$, and the source terminal of high side FET 194 is coupled to a load (not shown) at the output. Bootstrapping gate driver 170 receives a control signal at the input and drives high side FET 194 based on the input. A logic high input is indicative that high side FET 194 is to be turned off, and a logic low input is indicative that FET 194 is to be turned on. When FET 194 is turned on (based on the output from bootstrapping gate driver 170, which is in turn based on the input), it acts as a closed switch, connecting a load at the output to supply voltage $V_{dd}$.

Bootstrapping gate driver 170 includes FETs 120 and 135, resistor 145, and capacitor 150. The gate terminal of FET 120 receives the input, and the source terminal of FET 120 is coupled to ground. The drain terminal of FET 120 is coupled to resistor 145 at node 155. Resistor 145 is further coupled to the source terminal of FET 135 at node 140. The gate terminal and the drain terminal of FET 135 are shorted together, configuring FET 135 as a diode, and coupled to supply voltage $V_{dd}$. Alternatively, FET 135 can be replaced with a diode with its cathode connected to $V_{dd}$ and its anode connected to node 140.

Capacitor 150 is coupled between node 140 and the output. The gate terminal of FET 194 is coupled to node 155.

In response to a logic high input, FET 120 acts as a closed switch connecting node 155 to ground, causing high side FET 194 to turn off and act as an open switch and disconnecting the output from supply voltage $V_{dd}$. Capacitor 150 is charged from supply voltage $V_{dd}$ via FET 135 and FET 192.

In response to the input being logic low, FET 120 acts as an open switch, disconnecting node 155 from ground. Diode-configured FET 135 and pullup resistor 145 increase the voltage on node 155 above the threshold voltage VTH of FET 194 and turn it on. FET 194 then acts as a closed switch and connects the output to supply voltage $V_{dd}$. As the voltage on the output increases, energy stored in capacitor 150 discharges through node 140, pull up resistor 145, and node 155, which increases the voltage on nodes 140 and 155. As the voltage on the output approaches the supply voltage $V_{dd}$, the voltage on node 155 increases to approximately the voltage on the output plus the voltage across capacitor 150, above the supply voltage $V_{dd}$. The increased voltage above $V_{dd}$ on node 155 and the low on-resistance of FET 194 keep power FET 194 turned on as the voltage on its source terminal increases to approximately $V_{dd}$.

A turn-off FET 192 is incorporated into the gate driver. The gate terminal of FET 192 receives the input, and the source terminal of FET 192 is coupled to ground. The drain terminal of FET 192 is coupled to the output. In response to input being logic high, FET 192 acts as a closed switch, connecting the output to ground, and quickly decreasing the voltage at the output from approximately $V_{dd}$ to ground.

Bootstrapping gate driver 170 advantageously balances static currents during turn-off of FET 194 with the length of the turn-on time using resistor 145. A larger resistance for resistor 145 decreases static currents in bootstrapping gate driver 170 and reduces the overall power consumption of bootstrapping gate driver 170, but also slows the turn-on of FET 194.

For a logic high input, FETs 120 and 192 are on. Hence, the voltage at node 155 and the voltage at the output are at ground. The bootstrap capacitor 150 is charged to $V_{dd}$-$V_{GS\_135}$, where $V_{GS\_135}$ is the gate-to-source voltage of FET 135. If $V_{GS\_135}$ is assumed to be zero, the bootstrap capacitor will be charged to $V_{dd}$. Circuitry for eliminating $V_{GS\_135}$ is disclosed in co-pending application Ser. No. 18/062,660, entitled "Active Bootstrapping Drivers", the disclosure of which is incorporated by reference.

For a logic low input, FETs 120 and 192 are off. The voltage on the bootstrap capacitor 150 is applied to the $V_{GS}$ of FET 194 ($V_{GS\_194}$) via resistor 145, with the voltage at node 140 equal to the voltage at node 155 and turning on FET 194. The output will increase to $V_{dd}$ when the voltage at node 140 and the voltage at node 155 go above $V_{dd}$. due to the voltage stored on the bootstrap capacitor 150.

For a given bootstrap capacitor 150 having capacitance of CBS and a high side FET 194 having a gate-to-source capacitance of $C_{GS\_194}$, the gate-to-source voltage on FET 194 ($V_{GS\_194}$) will be equal to $V_{dd} \cdot C_{BS}/(C_{BS}+C_{GS\_194})$ for a logic low input. A lower $V_{GS\_194}$ when the input is a logic low leads to slower pulling "out" to $V_{dd}$.

The prior art bootstrapping circuit of FIG. 1 has the following disadvantages:

1. The bootstrap capacitor 150 must have a much greater capacitance than the gate-to-source capacitance of FET 194 ($C_{GS\_194}$) to achieve a gate-to-source voltage on FET 194 ($V_{GS\_194}$) close to $V_{dd}$. For example, if CBS is nine times greater than $C_{GS\_194}$, the gate-to-source voltage on FET 194 ($V_{GS\_194}$) will be 0.9· $V_{dd}$ for a logic low input. Hence, a large area is required for the bootstrap capacitor 150.

2. Also, the circuit of FIG. 1 requires a small resistor 145 to achieve fast settling on $V_{GS\_194}$ when the input is a logic low, which leads to high static power dissipation when the input is a logic high.

This second disadvantage noted above can be alleviated to a degree using a cascaded bootstrapping driver circuit 290 as shown in FIG. 2. Cascaded bootstrapping driver circuits are described in U.S. Pat. No. 10,790,811, the disclosure of which is incorporated by reference herein. In the final stage 285 of the bootstrapping driver circuit 290 of FIG. 2, the bootstrap resistor 145 is replaced with a FET 265, where the size of FET 265 is much less than the size of high side FET 294.

FET 265 is driven by a preceding (initial) bootstrapping stage 250. For a logic low input (0 volts), the gate voltage of FET 265 is greater than the voltage on node 260 by approximately $V_{dd}$, and increases in voltage when the voltage on node 260 increases in voltage because FET 265 is turned on. The increase in voltage at node 260 turns on high side FET 294 and the output voltage also increases. The voltages at nodes 240 and 270 are driven above $V_{dd}$, such that the output will be driven to about $V_{dd}$.

For a logic high input, FETs 265 and 294 are both off, and static current is only drawn through resistor 230, FET 235 and FET 220.

Since the size of FET 265 is much less than the size of high side FET 294, the bootstrap capacitor 245 can advantageously be much smaller than bootstrap capacitor 280.

The cascaded bootstrap circuit of FIG. 2 has the following additional advantages over the bootstrap circuit of FIG. 1:

1. The channel resistance ($R_{DS\_ON}$) of FET 265 is much smaller than the resistance of resistor 145 in the circuit of FIG. 1, such that high side FET 194 can be turned on in a much shorter time.

2. Resistor 230 can be much larger to reduce current consumption with a far lower penalty on the turn-on time of FET 265 (and also FET 294) due to the smaller size of FET 265.

However, the cascaded bootstrap circuit of FIG. 2 still suffers from the same two disadvantages of the bootstrap circuit of FIG. 1, except that the static power dissipation is reduced due to larger bootstrap resistor 230.

SUMMARY OF THE INVENTION

The present invention provides a pre-driven bootstrapping gate driver circuit that overcomes the above-noted deficiencies of the prior art. To reduce the size of the bootstrap capacitor, the gate-to-source voltage of the high side (pull-up) FET is pre-driven to an initial voltage (pre-driven voltage) before the bootstrap capacitor releases charge to charge up the gate-to-source voltage of the high side FET. This pre-driven voltage is applied through a pre-driven FET that allows current flow from the supply voltage to charge the gate of the high side FET to the pre-driven voltage. The pre-driven FET is turned on by a turn-on signal that occurs before the bootstrap capacitor releases charge. The pre-driven period (and hence, the pre-driven voltage) is determined from the time that the pre-driven FET begins to turn on, to the time that the bootstrap capacitor starts to release charge.

The pre-driven bootstrapping gate driven circuit of the present invention can be used in a cascaded bootstrapping gate driver circuit topology and/or in a multi-voltage bootstrapping gate driver circuit topology to include the additional features and advantages of those circuits.

BRIEF DESCRIPTION OF THE DRAWINGS

The above features, objects, and advantages of the present disclosure will become more apparent from the detailed description set forth below when taken in conjunction with the drawings, in which like reference characters identify correspondingly throughout and wherein.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. The combinations of features disclosed in the following detailed description may not be necessary to practice the teachings in the broadest sense, and are instead taught merely to describe particularly representative examples of the present teachings.

Figure 3:
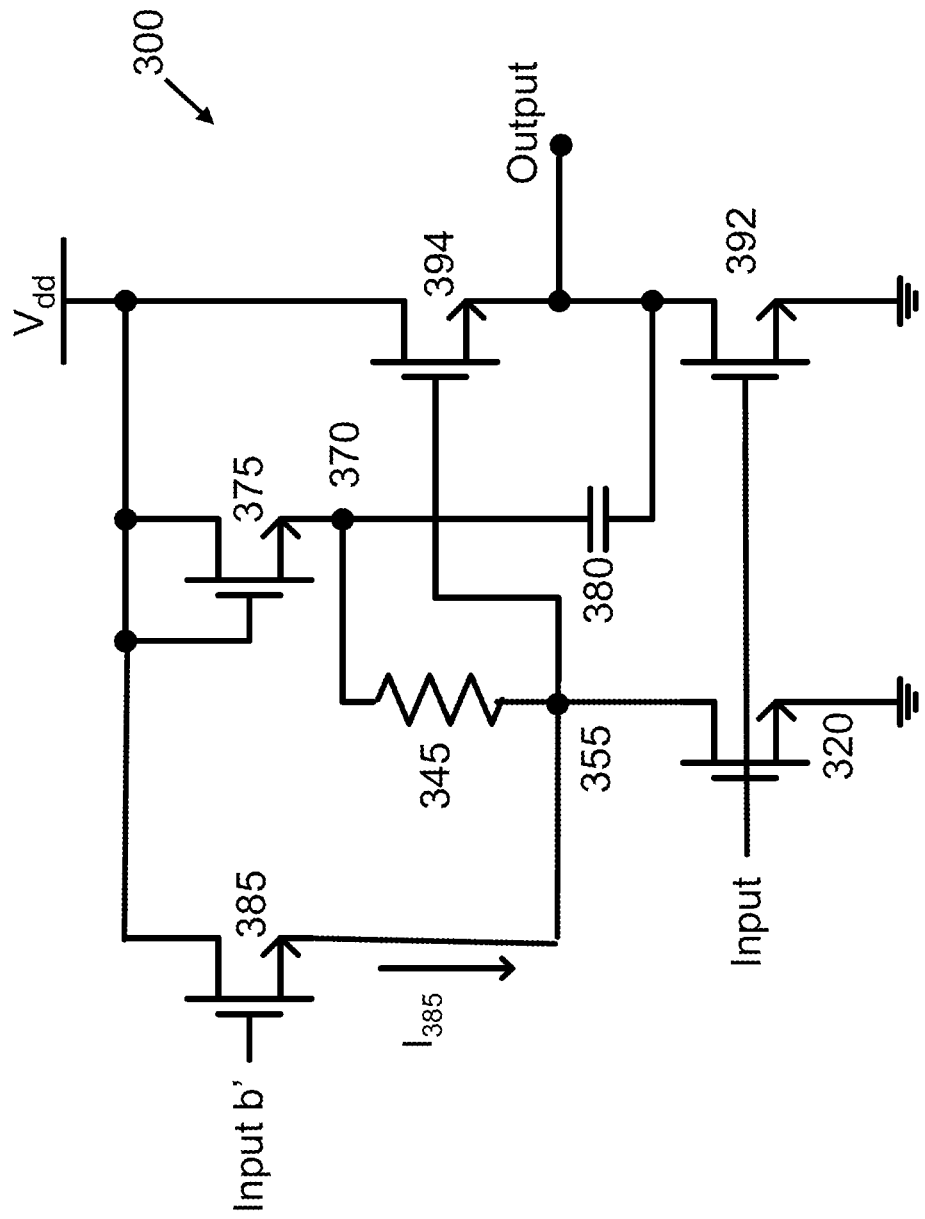
FIG. 3 is a schematic of a pre-driven bootstrapping gate driver circuit in accordance with a first embodiment of the present invention.

FIG. 3 shows a pre-driven bootstrapping gate driver circuit in accordance with a first embodiment of the present invention.

Figure 1:
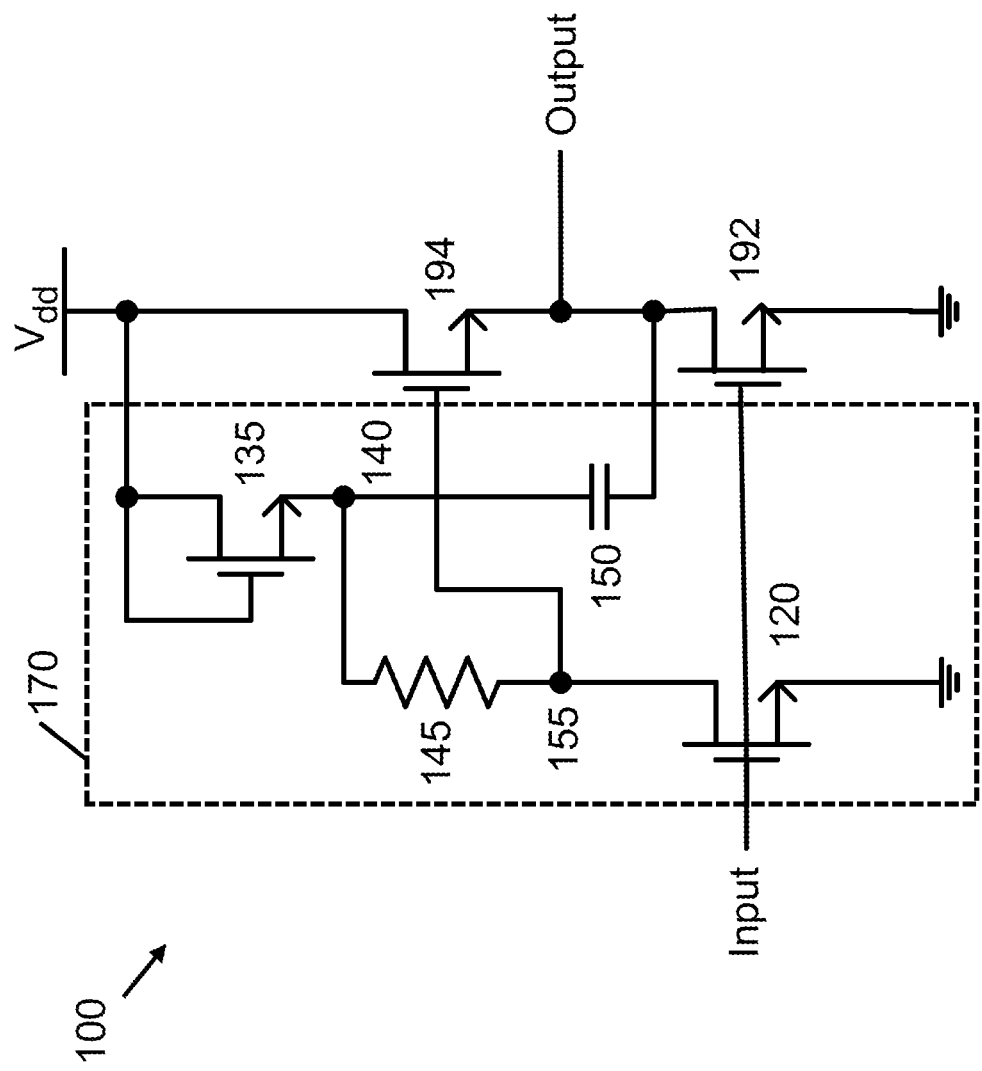
FIG. 1 is a schematic of a conventional bootstrapping gate driver circuit.

To reduce the total capacitance required in the bootstrapping gate driver circuit of FIG. 1, the gate-to-source voltage of the high side (pull-up) FET 394, $V_{GS\_394}$, is pre-driven initially to a pre-driven voltage, $V_{GPD}$, such that less charge from the bootstrap capacitor 380 is required to charge up the gate-to-source voltage ($V_{GS\_394}$) of the high side FET to the final desired voltage.

For example, if the gate-to-source capacitance of high side FET 394 is $C_{GS\_394}$, bootstrap capacitor 380 is charged to $V_{dd}$ initially, and the initial gate-to-source voltage of $V_{GS\_394}$ is $V_{GPD}$, then the final gate-to-source voltage of $V_{GS\_394}$ given as $V_{GS\_394}$ (F) will be:

$$V_{GS\_394}(F)=(V_{dd}\cdot C_{BS380}+V_{355}\cdot C_{GS\_394})/(C_{380}+C_{GS\_394})$$

If the desired $V_{GS\_394}$ (F) is $0.9\cdot V_{dd}$, and $V_{GBD}$ is about $0.3\cdot V_{dd}$, then the required $C_{BS394}$ can be calculated to be $6\cdot C_{GS\_394}$, which is 33.3% reduction from the required $C_{BS394}$ ($\sim 9\cdot C_{GS\_394}$) in FIG. 1.

To pre-drive the gate-to-source voltage of FET 394 ($V_{GS\_394}$), pre-driven FET 385 is added and coupled to the gate of high side FET 394. Pre-driven FET 385 is driven by the input b', which is the logic inversion of the input, but happens slightly earlier as shown.

Figure 4:
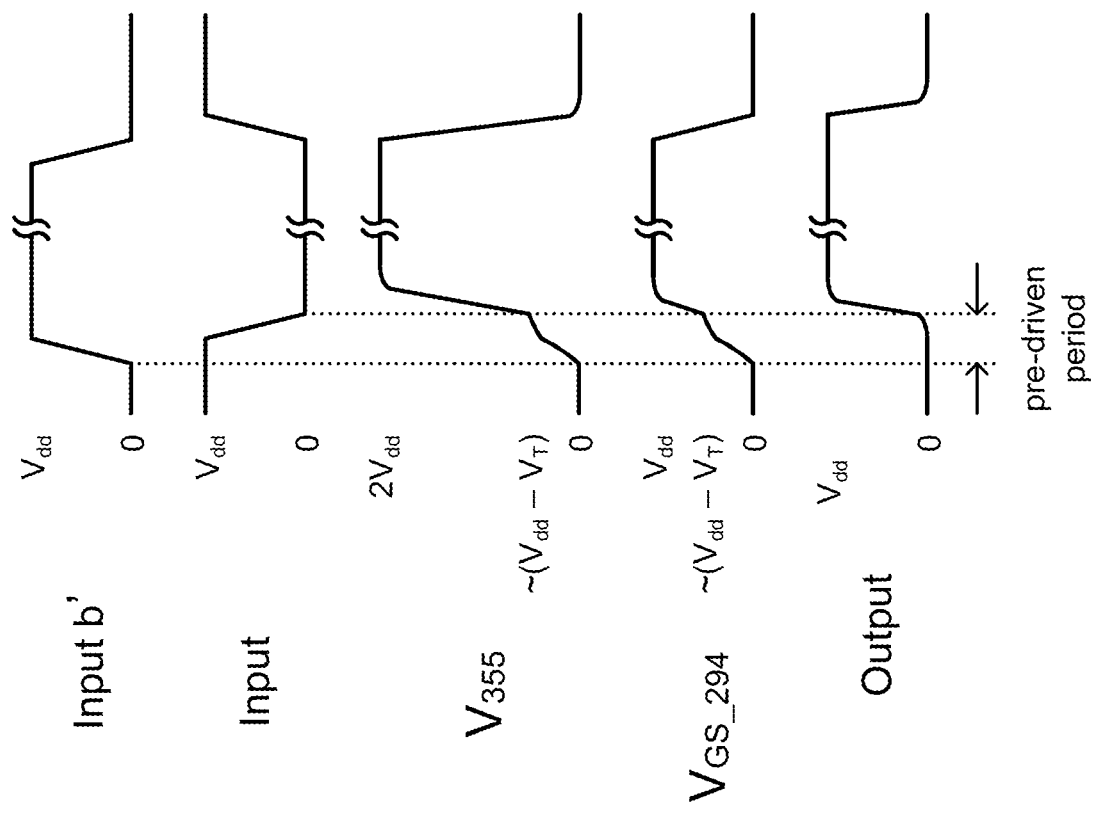
FIG. 4 is a timing diagram of the pre-driven gate driver circuit of FIG. 3.

As shown in the timing diagram of FIG. 4, when input b' turns high at the beginning of the pre-driven period, pre-driven FET 385 in FIG. 3 will start charging the voltage at node 355. When the input goes to approximately 0V at the end of the pre-driven period, the voltage at node 355 will be charged to the pre-driven voltage, $V_{GPD}$, which is higher than 0V. Then the gate-to-source capacitance of FET 394 ($C_{GS\_394}$) will continue to be charged by the bootstrap capacitor 380. At the same time, pre-driven FET 385 will be turned on and the output will be driven to $V_{dd}$. Since the output is driven to $V_{dd}$, the voltage at node 370 (and hence, the voltage at node 355) will be driven above $V_{dd}$.

Depending on the length of the pre-driven period, the maximum voltage at node 355 is limited to approximately ($V_{dd}$-$V_T$), where $V_T$ is the threshold voltage of pre-driven FET 385 in FIG. 3. The pre-driven current, $I_{385}$, will be gradually reduced to zero when the voltage at node 355 increases to approximately ($V_{dd}$-$V_T$).

When the voltage at node 355 in FIG. 3 is approximately ($V_{dd}$-$V_T$), the pre-driven FET 385 is turned off. Thus, when the voltage at node 355 goes even higher due to the voltage on bootstrap capacitor 380, the charge on the bootstrap capacitor 380 will not be discharged to $V_{dd}$ by the pre-driven FET 385.

If the voltage at node 355 in FIG. 3 at the end of the pre-driven period is slightly greater than $V_T$, pre-driven FET 385 will be just started to turn on. For a higher voltage at node 355 before the end of the pre-driven period, the pre-driven FET 385 will start to turn on earlier, but pre-driven FET 385 may not have a large gate-to-source voltage. As a result, pre-driven FET 385 may not be fully turned on with a larger output current. Hence, the output may suffer with a slow initial rise time.

If the voltage at node 355 in FIG. 3 is approximately equal to $V_T$ at the end of the pre-driven period, 1385 will still be non-zero. Together with the charge released from bootstrap capacitor 380, the voltage at node 355 will be charged up faster, leading to a shorter turn-on time for pre-driven FET 385 and hence, an overall faster rise time at the output.

When input b' and the input go back to low and high, respectively, the voltage at node 355 and the output will be driven to logic low. Then, the bootstrap capacitor 380 will be recharged to $V_{dd}$, getting ready for the next period of the output going from low to high.

FETs 320, 335, 375, 392 and 394 in FIG. 3 are preferably enhancement mode GaN FET semiconductor devices, which are monolithically integrated onto a single semiconductor die with the other components of system 300. GaN FETs switch more quickly than conventional FETs and allow bootstrapping gate driver 390 to turn high side FET 394 on and off more quickly than a similar system implementing other FETs, such as MOSFETs.

Figure 2:
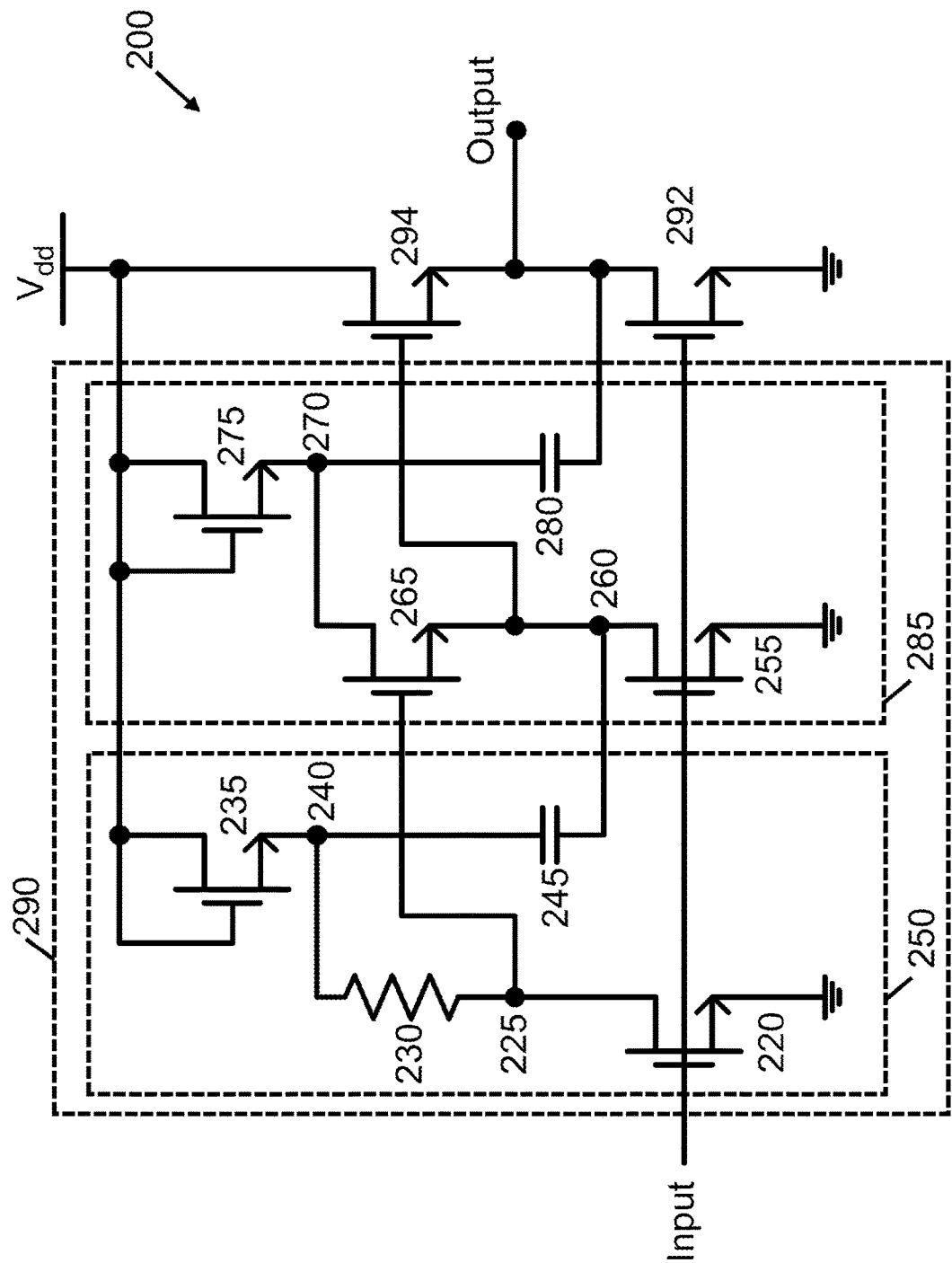
FIG. 2 is a schematic of a conventional cascaded bootstrapping gate driver circuit.
Figure 5:
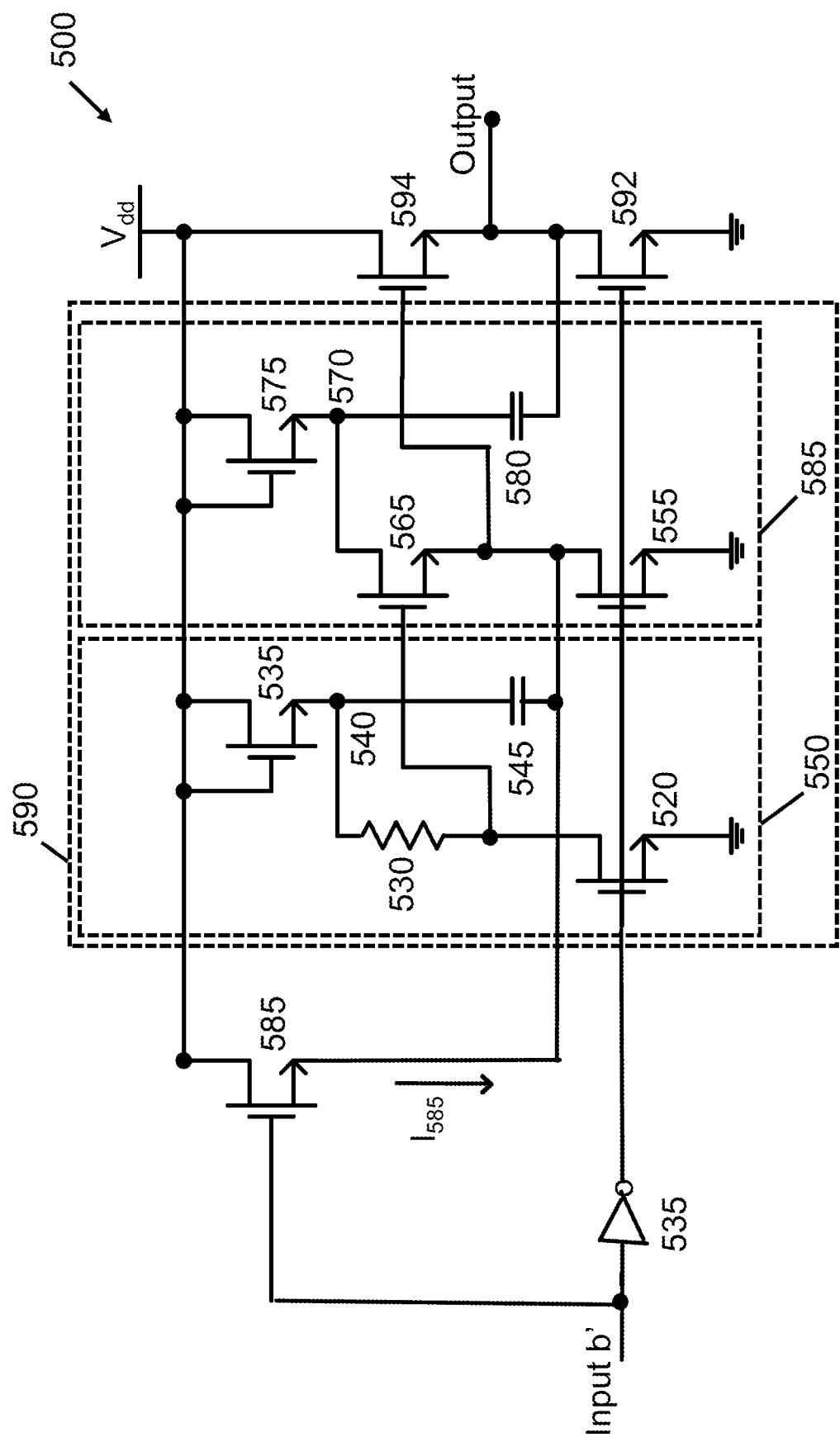
FIG. 5 is a schematic of a cascaded pre-driven bootstrapping gate driver circuit in accordance with a second embodiment of the present invention.

Referring now to FIG. 5, the pre-driven technique can be applied to the cascaded bootstrapping driver circuitry of FIG. 2. In this second embodiment of the invention, where like reference numbers in the 500's of FIG. 4 represent corresponding elements in the 300's of FIGS. 3 and 200's of FIG. 2, the pre-driven FET 585, is coupled to the gate of the final driving FET, high side FET 594.

Although only one cascade stage 550 of cascaded driver 590 is shown in FIG. 5, additional pre-driven FET stages can also be added to the preceding cascaded stage(s).

The pre-driven period is defined approximately by the high-to-low delay of the inverter 535. Inverter can be implemented using a bootstrapping stage similar to FIGS. 1 and 2.

Figure 6:
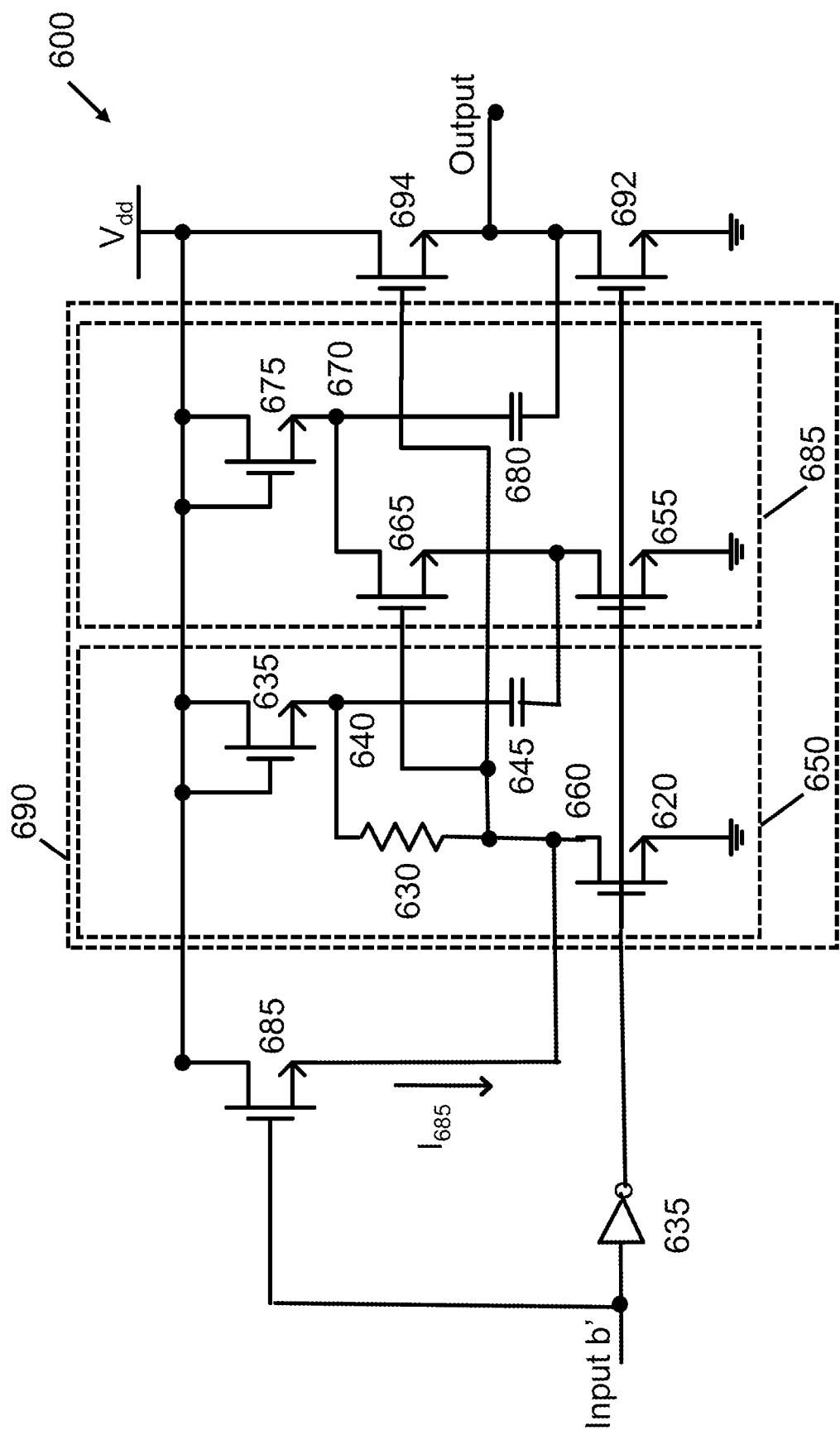
FIG. 6 is a schematic of the pre-driven bootstrapping gate driver circuit applied to the multi-voltage bootstrapping gate driver circuit.

Referring to FIG. 6, the pre-driven bootstrapping gate driver circuitry of the present invention can also be applied to the multi-voltage bootstrapping driver topology described in co-pending application Ser. No. 18/062,698, the disclosure of which is incorporated by reference, where the final high side (pull-up) FET 694, and FET 665 between bootstrap capacitors 680 and 645, are both pre-driven by pre-driven FET 685, such that the sizes of the bootstrap capacitors can be further reduced.

The pre-driven bootstrapping drivers of the present invention have the following features and advantages:

The area of the bootstrap capacitors is usually the dominant area for bootstrapping drivers implemented in GaN technology. The pre-driven bootstrapping driver circuitry of the present invention allows the size of the bootstrap capacitors to be reduced.

The pre-driven bootstrapping driver circuitry of the present invention can be used in conjunction with other bootstrapping driver circuits, including cascaded bootstrapping driver circuits and multi-voltage bootstrapping driver circuits, as described in connection with FIGS. 5 and 6, respectively.

When the pre-driven voltage is adjusted to about the threshold voltage of the FET (approximately equal to $0.3 \cdot V_{dd}$ to $0.4 \cdot V_{dd}$) by adjusting the pre-driven period, the size of the bootstrap capacitors can be reduced by 33.3% to 44.4%.

Since the multi-voltage bootstrapping driver circuit of FIG. 6 can reduce the bootstrap capacitor size by approximately 50%, the total capacitor size reduction is 66.7% to 72.2% when the pre-driven circuitry of the present invention and multi-voltage bootstrapping driver circuits are combined in a single bootstrapping driver.

Since the bootstrap capacitor for the final high side (pull-up) FET of a cascaded bootstrapping driver is reduced in size, the FETs for switching the bootstrap capacitors in the preceding cascaded stages can be reduced. As a result, the bootstrap capacitor in each cascaded stage can also have a smaller size. This leads to a further overall reduction of the driver size.

Smaller bootstrap capacitor sizes also lead to faster settling on all the cascaded bootstrapping stages. Hence, the proposed technique also improves the overall rise time of the driver.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A bootstrapping gate driver for a high side FET having a drain terminal connected to a supply voltage, a source terminal connected to an output, and a gate terminal, the bootstrapping gate driver comprising:
    an input for receiving a control signal; and
    a bootstrap capacitor electrically connected between the voltage source and the output, the output being connected to ground by a low side FET when the control signal corresponds to a charging phase, thereby charging the bootstrap capacitor to a charged voltage without delay, the bootstrap capacitor being electrically connected to the gate terminal of the high side FET such that, when the control signal corresponds to a driving phase and the bootstrap capacitor is electrically disconnected from ground by the low side FET, the charged voltage on the bootstrap capacitor is applied to the gate of the high side FET to provide an output voltage at the output;
    a pre-driven charging circuit comprising a pre-driven FET having a drain terminal connected to the supply voltage, a source terminal connected to the gate terminal of the high side FET, and a gate, wherein the gate of the pre-driven FET receives a logic inversion of the control signal during a pre-driven period before the control signal at the input corresponds to the charging phase, such that, during the pre-driven period before the charging phase, the pre-driven FET allows current to flow from the supply voltage to apply a pre-driven voltage to the gate terminal of the high side FET, such that less charge from the bootstrap capacitor is required to charge the gate terminal of the high side FET to a final desired voltage during the charging phase.

2. The bootstrapping gate driver of claim 1, further comprising a resistor electrically connected between the voltage source and the gate of the high side FET to decrease static current consumption.

3. The bootstrapping gate driver of claim 1, wherein the low side FET has a drain terminal connected to the source of the high side FET and the output, a gate terminal connected to the input, and a source terminal connected to ground.

4. The bootstrapping gate driver of claim 1, wherein the bootstrapping gate driver is cascaded and comprises at least one additional stage of charging circuitry including a charging FET and an additional bootstrap capacitor.

5. The bootstrapping gate driver of claim 4, wherein the charging FET is smaller than the high side FET, and wherein the bootstrap capacitor is smaller than the additional bootstrap capacitor of the additional stage of charging circuitry.

6. The bootstrapping gate driver of claim 5, further comprising further additional stages, each having a respective charging FET pre-driven by the pre-driven FET.

7. The bootstrapping gate driver of claim 1, further comprising at least one additional bootstrap capacitor electrically connected in parallel with the bootstrap capacitor between the voltage source and ground when the control signal corresponds to a charging phase, thereby charging the bootstrap capacitor and the at least one additional bootstrap capacitor in parallel, the bootstrap capacitor and the at least one additional bootstrap capacitor being electrically connected in series between the gate terminal and the source terminal of the high side FET when the control signal corresponds to a driving phase.

8. The bootstrapping gate driver of claim 1, wherein the FETs of the bootstrapping gate driver are gallium nitride (GaN) FETs.

* * * * *